United States Patent [19]

Ito et al.

[11] Patent Number: 5,278,499
[45] Date of Patent: Jan. 11, 1994

[54] FIBEROPTIC APPARATUS FOR MEASURING ELECTROMAGNETIC FIELD INTENSITY WITH AN ELECTRO-OPTIC SENSOR

[75] Inventors: Hiroshi Ito, Kasugai; Tadashi Ichikawa; Satoru Kato, both of Aichi, all of Japan

[73] Assignee: Kabushiki Kaisha Toyota Chuo Kenkyusho, Aichi, Japan

[21] Appl. No.: 787,791

[22] Filed: Nov. 4, 1991

[30] Foreign Application Priority Data

Nov. 5, 1990 [JP] Japan .................... 2-299414

[51] Int. Cl.[5] .................. G01R 33/02; G02B 5/14; H01J 5/16; G01D 5/34
[52] U.S. Cl. .................. 324/244.1; 250/227.14; 356/351
[58] Field of Search ............ 324/244.1, 96, 260; 250/227.11, 227.14; 356/351, 352

[56] References Cited

U.S. PATENT DOCUMENTS

H371   11/1987  Bobb ..................... 324/244.1
4,533,829  8/1985  Miceli et al. ............. 324/96
4,560,867  12/1985  Papuchan et al. .......... 324/96

*Primary Examiner*—Walter E. Snow

*Attorney, Agent, or Firm*—Oblon, Spivak, McClelland, Maier & Neustadt

[57] ABSTRACT

An electromagnetic field intensity measuring apparatus comprises a sensor located in the electromagnetic field measuring place for receiving the measuring light from the optical fiber, the sensor being adapted to modulate the measuring light entering the sensor depending on the intensity of the electromagnetic field, the modulated light being then re-applied to the optical fiber; a polarization rotating device located between the measuring light generating device and the optical fiber, the polarization rotation device being operative to cause the polarized wavefront of the measuring light passed therethrough to rotate a given angle in the direction of passage; and a polarization beam splitter disposed between the measuring light generating device and the polarization rotating device, the polarization beam splitter being operative to permit only the measuring light from said measuring light generating device to pass through said polarization beam splitter and also to reflect the modulated measuring light inputted through the polarization rotating device in a predetermined direction. The electromagnetic field intensity in the measuring place can be calculated, based on the amplitude of the measuring light reflected by the polarization beam splitter.

20 Claims, 5 Drawing Sheets

FIBEROPTIC APPARATUS FOR MEASURING ELECTROMAGNETIC FIELD INTENSITY WITH AN ELECTRO-OPTIC SENSOR

BACKGROUND OF THE INVENTION

1. Field of the Invention

The present invention relates to an improved apparatus for optically measuring the intensity of an electromagnetic field.

2. Description of the Related Art

As well known, electromagnetic waves are currently utilized in various fields of art. In the modern information-oriented society, particularly, the electromagnetic waves are increasingly being important as information transmission media for broadcasting and communication. In addition, the utilization of electromagnetic waves is spreading as a source of energy which can be used in semiconductor making systems, plasma heating systems and so on.

In order to improve the aforementioned techniques, therefore, it is required to grasp the state of electromagnetic field more accurately.

On the other hand, troubles are increasing with respect to dysfunctions of various electronic instruments created by electromagnetic waves. In the fields of office automation instruments and motorcar electronics which require to process information in bulk and at high-speed, these dysfunctions not only damage the electronic instruments, but also may create a social confusion or a danger against human's life. Very important subject is a countermeasure of electromagnetic interference (EMI).

In order to work out a countermeasure of EMI, thus, it is more required to grasp the state of electromagnetic field accurately. This is true of the environmental problem. For example, intense electromagnetic field MAY be in danger of injuring human's body. An animal experiment has reported that when animals were exposed to electromagnetic waves, an increase in heart rate and body heat was found as well as necrosis of animals' tissues. Our living environment is now subjected to electromagnetic waves having various levels of intensity and frequency which may damage human's health. Safety standards relating to the intensity of electromagnetic wave is thus desired. This also requires the accurate measurement of electromagnetic field intensity.

To this end, various types of electromagnetic field intensity measuring systems have been proposed.

One of these proposed systems comprises a probe antenna functioning as a sensor which is located in an electromagnetic field, the sensor generating electric signals which are transmitted to a detector through a cable of conductive metal material, the detector being disposed outside of the electromagnetic field to be measured.

However, the use of such a metallic cable not only precludes the freedom of the probe antenna on movement and arrangement, but also disturbs the electromagnetic field to be measured, resulting in inaccurate measurements.

In order to overcome such a problem, there has also developed electromagnetic field intensity measuring systems which utilize an electro-optic crystal such as $LiNbO_3$ or the like.

FIG. 3 shows one of such systems which comprises a sensor section 10 located in a measurement place 100, a source of light 12 disposed outside the measurement place 100 and an optical detector 14 similarly disposed outside the measurement place 100. These components are optically connected together through optical fibers 16 and 18 for inputting and outputting a measuring light, respectively.

The sensor section 10 comprises a polarizer 20, an electro-optic crystal 22, an analyzer 24, probe antennas 26a and 26b, and a pair of electrodes 28a and 28b disposed on the opposite sides of the electro-optic crystal 22. The electrodes 28a and 28b are connected with the antennas 26a and 26b, respectively.

On operation, the light source 12 emits a measuring light toward the sensor section 10 through the optical fiber 16.

The electro-optic crystal 22, which is the primary part of the sensor section 10, is cut along X-axis, Y-axis and Z-axis such that the measuring light from the light source 12 is deflected by the polarizer 20 in the X-axis direction as a linear polarized light wave which is inclined 45 degrees relative to the Y-axis. The light wave entering the electro-optic crystal 22 through the polarizer 20 will be decomposed into an ordinary ray component (Y-axis) and an extra-ordinary ray component (Z-axis), which components are independently propagated.

An electromagnetic field detected by the antennas 26a and 26b is applied between the electrodes 28a and 28b as a potential difference. Such a potential difference causes an electro-optic effect in the crystal 22, which effect varies the refractive inside of the crystal 22 relative to the extra-ordinary ray. As a result, the light waves in the two components passed through the electro-optic crystal 22, that is, the ordinary and extraordinary light waves will have a phase difference therebetween. Such a phase difference is then detected by the analyzer 24 which is arranged perpendicular to the polarizer 20. If there is no phase difference between the ordinary and extra-ordinary light waves, this means that the initial linear polarized light ray is maintained and that the amplitude of the light passed through the analyzer 24 is zero. If any phase difference is created by the electromagnetic field, the light waves become elliptical-polarized light waves which will create a component passed through the analyzer 24. The amplitude of the light passed through the analyzer 24 depends on the potential difference applied thereto. When the light rays passed through the analyzer 24 are conducted to the optical detector 14 through the optical fiber 18 wherein the amount thereof is measured, one can measure the potential difference applied to the electro-optic crystal 22, that is, the intensity of the electromagnetic field.

In such a prior art system, the sensor section 10 and optical fibers 16, 18 are substantially made of dielectric material. Thus, the electromagnetic field in the measurement place 100 will not substantially be disturbed. As a result, the accurate measurement of electromagnetic field intensity can be accomplished.

On the contrary, the prior art system has a problem in that its sensitivity of measurement for electromagnetic field is very low, resulting in difficulty on measurement of the feeble intensity of electromagnetic field. For example, even if a subminiature crystal 22 of 1 mm square is used, a voltage as much as 300 V is required to cause the phase of rays passed through the crystal 22 to vary through 180 degrees. Depending on the gain in the antennas 26a and 26b, it is extremely difficult to measure the electromagnetic field if its intensity is weak.

In order to overcome such a problem, it has been proposed that a waveguide type Mach-Zehnder interferometric modulator is used in place of the bulk crystal.

FIG. 4 shows one of such systems as constructed in accordance with such a proposal. In FIG. 4, parts similar to that of FIG. 3 are designated by similar reference numerals and will not be further described.

In this system, a sensor section 10 comprises a pair of antenna metals 34a and 34b and a integrated optics 36 functioning as a waveguide type modulator. The integrated optics 36 includes an internal waveguide 38 for propagating a measuring light from an optical fiber 16. The waveguide 38 includes first and second modulating waveguide portions 38a and 38b branched and recombined in a modulating section 40. The first and second modulating waveguide portions 38a and 38b receive voltage signals through electrodes 28a and 28b, respectively. The voltage signals are field detection signals which are outputted from the antenna metals 34a and 34b and which are opposite to each other in polarity.

In such an arrangement, when the sensor section 10 receives a coherent measuring light from the light source 12 through the optical fiber 16, the measuring light will be propagated into the optical modulator section 40 through the waveguide 38 of the integrated optics 36.

Voltage signals detected by the pair of antenna metals 34a and 34b, which signals are representative of the intensity of electromagnetic field, are applied to the first and second modulating waveguide portions 38a and 38b through the electrode 28a and 28b. Since the applied voltages are opposite to each other in polarity, a phase difference is created in the light waves after they have passed through the waveguide portions 38a and 38b. When the light waves are re-combined in a wave combining section 39, the degree of phase difference is converted into signals indicative of the intensity of electromagnetic field. These signals are applied to an optical detector 14 through an optical fiber 18. Since several volts is at most required to vary the light amplitude from maximum to minimum, the sensitivity increases about 100 times higher than that of the system shown in FIG. 3.

When the modulated measuring light from an integrated optics 36 is detected by the optical detector 14 with respect to the amplitude thereof and the resulting signals from the optical detector 14 are inputted into a signal processing circuit 36, the latter can calculate the amplitude of the modulated measuring light, the level of the phase difference and the intensity of the electromagnetic field, the results being displayed on a display 32.

In such a manner, the prior art system can measure the weak intensity of electromagnetic field since the electromagnetic field can be measured more sensitively in the measuring place 100.

However, the sensor section 10 of the prior art system includes the integrated optics 36 and the optical input and output fibers 16 and 18 connected to the integrated optics 36. Therefore, the sensor section 10 cannot be reduced up to such a size as be sufficient in practice. It is thus difficult that the prior art system makes measurement in smaller places.

More particularly, the sensor section 10 is preferably of a cantilevered structure. In such a case, however, one of the two optical fibers 16 and 18 must be bent in the completely opposite direction.

As well-known, the optical fibers are relatively flexible, but has its acceptable minimum range of flexure which is in the order of several centimeters. If it is wanted to reduce the size of the sensor section 10 by bending one of the optical fibers as shown by 18 in FIG. 5, it is extremely difficult to reduce the size of the sensor section 10 up to a practically required value equal to or less than 20 mm.

It can be considered that a tortuous waveguide 38 is formed in the integrated optics 36, rather than the bending of the optical output fiber 18. In general, the waveguide 38 has its refractive index higher than the surrounding material to confine and guide light waves therein. However, the difference of refractive index between the waveguide 38 and the surrounding material is at most ranged between $10^{-2}$ and $10^{-3}$. Consequently, a loss of guide will increase if the waveguide 38 is bent as aforementioned.

As well-known, the connections between the optical fibers and the waveguide require the most accurate adjustment and tend to vary its characteristics due to any mechanical deviation from variations of temperature, vibration and the like.

In such an arrangement that two optical fibers 16 and 18 are used as in the prior art, two connections between the optical fibers 16, 18 and the waveguide 16 are required which are cumbersome to make these connections. This resulted in a cause by which a system capable of steadily operating for a prolonged period is manufactured more inexpensively.

SUMMARY OF THE INVENTION

It is therefore an object of the present invention to provide an electromagnetic field intensity measuring apparatus including sensor means which is reduced in size, increased in sensitivity and more steadily operable.

To this end, the present invention provides an electromagnetic field intensity measuring apparatus comprising:

measuring light generating means for emitting a coherent measuring light linearly polarized in a given direction;

optical fiber means for conducting said measuring light to an electromagnetic field measuring place;

sensor means located in said electromagnetic field measuring place for receiving the measuring light from said optical fiber means, said sensor means being adapted to modulate the amplitude of the measuring light entering the sensor means depending on the intensity of the electromagnetic field, the modulated light being then re-applied to said optical fiber means;

polarization rotating means located between said measuring light generating means and said optical fiber means, said polarization rotation means being operative to cause the polarized wavefront of the measuring light passed therethrough to rotate a given angle in the direction of passage;

a polarization beam splitter disposed between said measuring light generating means and said polarization rotating means, said polarization beam splitter being operative to permit only the measuring light from said measuring light generating means to pass through said polarization beam splitter and also to reflect the modulated measuring light inputted through said polarization rotating means in a predetermined direction; and calculator means for calculating the intensity of electromagnetic field in the electromagnetic field measuring place, based on the amplitude of the measuring light reflected by said polarization beam splitter, said sensor means comprising:

antenna section for detecting the electromagnetic field and also for outputting a voltage corresponding to the intensity of the detected electromagnetic field; and an integrated optics including a waveguide formed therein, one end of said waveguide being a measuring light entering section and the other end thereof being a measuring light reflecting section, and optical amplitude modulating means operative to apply a voltage signal outputted from said antenna section to said waveguide and also to modulate the amplitude of the measuring light propagated through the waveguide depending on the intensity of the ectromagnetic field before the modulated measuring light is outputted therefrom.

The measuring light generating means preferably comprises a source of laser light for emitting a coherent laser beam and an optical system for collimating and linearly polarizing the emitted laser beam in a given direction, the collimated and polarized laser beam being then outputted from said optical system to said polarization beam splitter.

The source of laser beam may be of any one of HeNe laser, YAG laser, semiconductor laser and so on. In view of the matching to the optical fiber, the source of laser beam is preferably a semiconductor laser.

The polarization rotating means may be composed of Farady rotator or the like which can rotate the polarized wave front of the light waves passed therethrough.

The optical fiber used to input the measuring light may be of any one of multi-mode fiber (MMF), single-mode fiber (SMF), polarization-maintaining fiber (PMF) and others. In respect of various factors such as efficiency of light utilization, stability and others, it is preferred to use the polarization-maintaining fiber.

The optical magnitude modulator means in the integrated optics may be of any one of Mach-Zehnder interferometer type, directional coupler type, crossing type and others.

The integrated optics may be formed of any one of ferroelectric material such as $LiNbO_3$ or $LiTaO_3$, semiconductor such as GzAlAs or Si and amorphous material such as $SiO_2$ or $Si_3N_4$. The use of $LiNbO_3$ is preferred since it has a higher electro-optic effect.

The antenna section may be of any suitable configuration. For example, a minute dipole antenna may be used to detect electromagnetic fields of high-frequency. A metallic plate having a suitable size may be used to detect electromagnetic fields of low-frequency. Particularly, if such a metallic plate is used in the antenna section, it may be formed on the same substrate as that of the integrated optics in the form of an integrated set of antennas which are formed on the substrate as by the photolithograph. This enables the entire sensor to be reduced in size.

It is further preferred that the measuring light reflecting portion of the integrated optics is formed on the ground end face of the integrated optics in the form of a thin film of a metal such as Al or Au or dielectric by any suitable means such as vapor deposition, spattering or the like.

When an electromagnetic field is to be measured by the use of the measuring apparatus according to the present invention, the sensor means is first located in the field measuring place while the measuring light generating means and calculator means are disposed outside of the field measuring place.

When a coherent measuring beam linearly polarized is emitted from the measuring light generating means, the measuring beam enters the polarization beam splitter. After passed through the polarization beam splitter, the measuring beam enters the polarization rotating means through which the polarized wavefront of the measuring beam is rotated by a given angle. Thereafter, the rotated measuring beam is inputted into the sensor means through the optical fiber means.

The sensor means comprises an antenna section and an integrated optics. The integrated optics includes an internal waveguide which has one end formed as a measuring light entering portion and the other end formed as a measuring light reflecting section.

The waveguide is formed to extend past the optical amplitude modulator means in which the amplitude of the measuring light passed through the waveguide will be modulated depending on the intensity of any external electromagnetic field detected by the antenna section.

In accordance with the present invention, particularly, the measuring light beam entering the waveguide passes through the optical amplitude modulator means before it reaches the reflecting portion. In addition, the measuring light beam reflected by the reflecting portion again passes through the optical amplitude modulator means. The measuring light beam modulated two times with respect to its optical amplitude when it is reciprocated one time within the waveguide. Therefore, the sensitivity is increased to about two times higher than that of the conventional non-reflection type integrated optics.

The measuring beam modulated with respect to its optical amplitude is then outputted from the waveguide of the integrated optics and enters the polarization beam splitter through the optical fiber and the polarization rotating means. At this time, the polarization rotating means further rotates the measuring light beam passed therethrough or being modulated by a given angle in the direction of passage. Thereafter, the measuring beam enters the polarization beam splitter.

The measuring light beam entered and modulated by the polarization beam splitter has its polarized wavefront different in angle from that of the measuring light beam inputted from the measuring light generating means. Thus, that measuring light beam cannot pass through the polarization beam splitter, but is reflected toward the calculator means.

The calculator means computes the intensity of the electromagnetic field in the electromagnetic field measuring place, based on the amplitude of the measuring light thus reflected.

In accordance with the present invention, the measuring light beam will be inputted to and outputted from the sensor means through only a single optical fiber. Therefore, a cantilever type sensor means can be simply formed and reduced in size without any bending of the optical fiber as in the prior art.

Since the measuring light beam is reciprocated one time through the optical amplitude modulator means in the sensor means, it will be modulated two times with respect to its amplitude. Thus, the sensitivity of the sensor means can be increased two times higher than that of the prior art sensor means. If the sensitivity is to be maintained at the same level, the sensor means of the present invention can be reduced to a size about one-half that of the non-reflecting type sensor.

In such a manner, the sensor means may be of a cantilever type structure without any bending in the optical fiber and yet the amplitude of the measuring light beam may be modulated two times since it passes through the optical amplitude modulator means two times on reciprocation. Therefore, the sensor means may be greatly reduced in size and may be used in a space as small as the measurement of electromagnetic field could not be carried out.

Furthermore, the present invention provides stable measurements for an prolonged period since the waveguide of the sensor means is connected to the optical fiber only at a single point. More particularly, the connection between the optical fiber and the waveguide is very delicate in adjustment and tends to create changes in characteristics due to any mechanical deviation when the system is used for a prolonged period. Since the present invention utilizes only a single optical fiber for performing both the input and output of a measuring light, rather than two optical fibers, only a single connection is required between the optical fiber and the waveguide. Thus, the present invention can provide an electromagnetic field intensity measuring apparatus which can steadily perform measurements with high-accuracy through a prolonged period and which can be manufactured more inexpensively.

If it is desired that the electromagnetic field intensity measuring apparatus of the present invention includes a Mack-Zehnder interferometer type optical amplitude modulator located in the integrated optics, the electromagnetic field intensity measuring apparatus is preferably characterized by that said waveguide includes first and second modulating waveguide portions branched at the branching and combining point, each of said first and second modulating waveguides having a measuring light reflecting portion formed therein at the other end, said optical amplitude modulator including electrode means for applying voltage signals from said antenna sections to said first and second modulating waveguide portions in the opposite polarities, respectively. After the measuring lights propagating in the modulating waveguide portions have been changed in phase, they are recombined combined and caused to interfere with each other at the branching and combining point such that the measuring light will be modulated in amplitude before outputted, depending on the intensity of the electromagnetic field.

In the above arrangement, the measuring light entering the waveguide through the optical fiber is directed into the first and second modulating waveguide portions in the optical amplitude modulator before they are reflected by the respective measuring light reflecting portions. After reflected, the branched measuring light parts are propagated in the opposite direction through the first and second modulating waveguide portions. After these light parts have passed through the optical amplitude modulator, they are re-combined and caused to interfere with each other at the branching and combining point.

At the optical amplitude modulator, the voltage signals outputted from the antenna section are applied to the first and second modulating waveguide portions which are in turn varied in refractive index. This will vary the phases of the light waves in the measuring light parts propagating in the first and second modulating waveguide portions.

Since the voltage signals having the opposite polarities are applied to the first and second modulating waveguide portions, the light waves propagating in the respective waveguide portions also have their phases opposite to each other in polarity. This results in a phase difference.

In the system of the present invention, particularly, the measuring light is reciprocated through the first and second modulating waveguide portions so that it will passes through the optical amplitude modulator two times. Thus, the phases of the light waves propagating through the waveguide portions will be changed two times.

When the measuring light passed through the first and second modulating waveguide portions are re-combined and caused to interfere with each other at the branching and combining point, the degree of variations in phase will be converted into the amplitude of light.

In other words, the measuring light outputted from the optical amplitude modulator has the maximum amplitude if there is externally no electromagnetic field. If the phase difference is 180 degrees, the measuring light has the minimum amplitude.

When the amplitude of the measuring light modulated and outputted by the optical amplitude modulator is measured, the degree of phase difference and thus the intensity of the electromagnetic field can be determined.

It is preferred that the electromagnetic field intensity measuring apparatus of the present invention further comprises a polarizer located between the polarization rotating means and the optical fiber means, the polarizer being operative to permit the passage of only a portion of the measuring light having its polarized wavefront which is rotated by said polarization rotating means in a given direction. This removes noise components from the measuring light inputted from the integrated optics through the optical fiber before it is outputted toward the polarization rotating means.

Although the optical fiber and integrated optics have good polarization-maintaining properties, it cannot be avoided that these elements generate light components (light waves containing noise components) which are polarized in a direction of polarization axis different from that of the original polarized wavefront due to various factor such as temperature, pressure, vibration and the like, during propagation of the measuring light through the optical fiber and integrated optics.

If a polarizer is disposed between the polarization rotating means and the optical fiber as in the present invention, any light waves containing noise components can be removed from the modulated measuring light inputted through the optical fiber. This enables the intensity of the electromagnetic field to be measured more accurately.

The electromagnetic field intensity measuring apparatus of the present invention is preferably characterized by that said calculator means includes an optical detector for converting a measuring light entering said optical detector into an electric signal, a first signal processing section for extracting and outputting a detecting signal component used to detect the intensity of an electromagnetic field from said electric signal, a second signal processing section for extracting and outputting a low-frequency signal containing any disturbance component from said electric signal, and a calculating section responsive to the signal from said second signal processing section for removing the disturbance component from said detecting signal component outputted from said first signal processing section and for calculating the intensity of the electromagnetic field in the electromagnetic field measuring place, whereby the intensity of the electromagnetic field can be determined without affection of any disturbance.

In general, the measuring light modulated and outputted by the optical amplitude modulator in the sensor means contains various disturbance components from the optical fiber and sensor means, for example, due to temperature, vibration, pressure and so on. Particularly, such disturbance components may be more contained in a measuring light used to measure the intensity of an electromagnetic field in the low-frequency range.

In accordance with the present invention, the calculator means comprises the optical detector, first and second signal processing sections such that the modulated measuring light is converted into an electrical signal by the optical detector before it is inputted into the first and second signal processing sections.

The first signal processing section is responsive to the electric signal inputted thereinto to extract and output the detecting signal toward the calculating section.

The second signal processing section is operative to extract and output a signal approximate to a DC component from the electric inputted signal toward the calculating section. This DC component contains disturbance components representative of variations of the source intensity, propagation loss in the optical fiber and so on.

Consequently, the calculating section can be responsive to the electric signal from the second signal processing section to remove the disturbance components from the detecting signal from the first signal processing section and to determine the intensity of an electromagnetic field in the field measuring place without affection of any disturbance.

DETAILED DESCRIPTION OF THE PREFERRED EMBODIMENT

Figure 1:
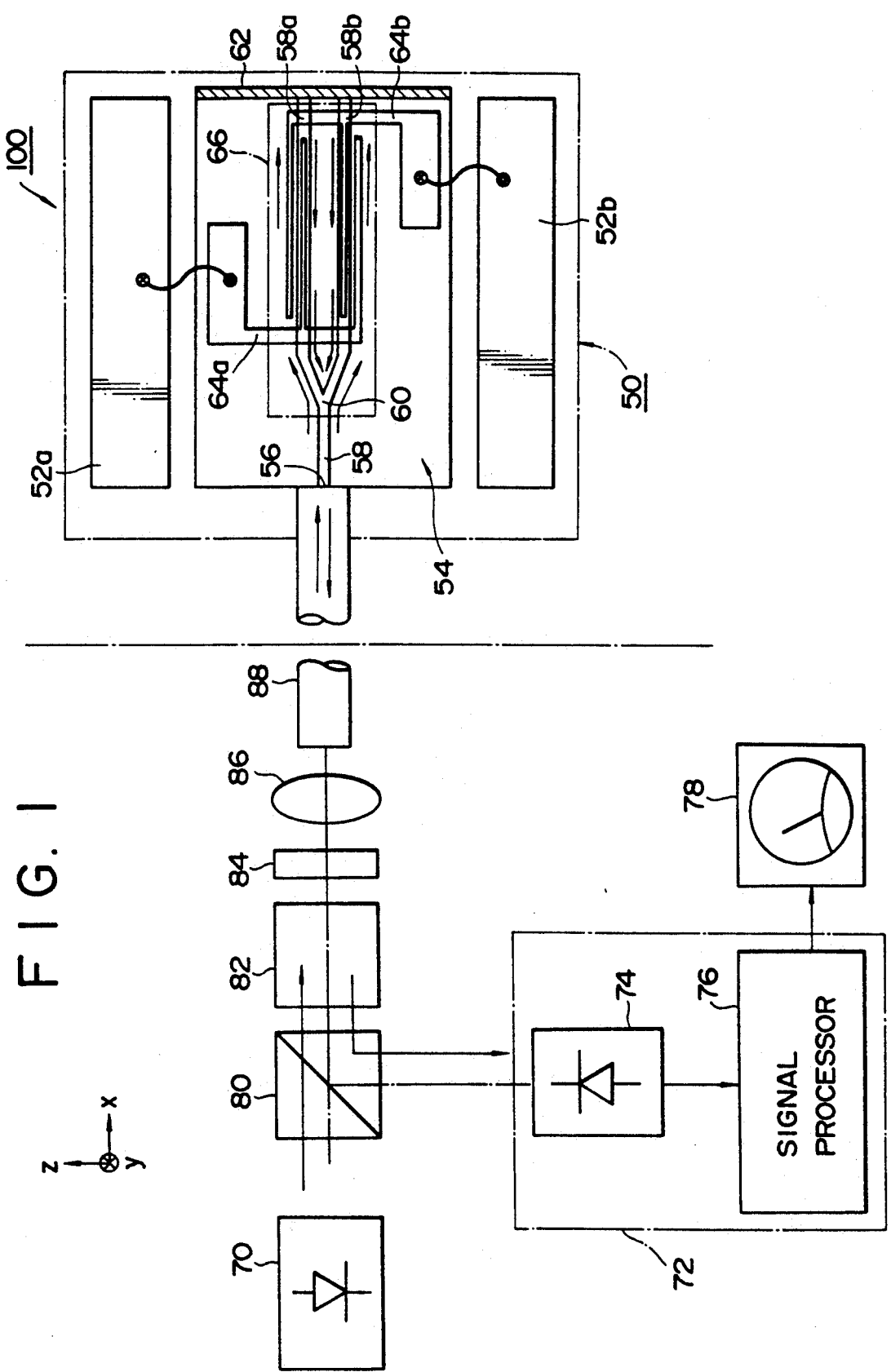
FIG. 1 is a block diagram of one preferred embodiment of an electromagnetic field intensity measuring apparatus constructed in accordance with the present invention.

Referring to FIG. 1, there is shown a preferred embodiment of an electromagnetic field intensity measuring apparatus constructed in accordance with the present invention. The apparatus comprises a sensor section 50 located in an electromagnetic field measuring place 100, a measuring light generating section 70, a calculator circuit 72 for calculating the intensity of an electromagnetic field and a display section 78, the last three of which are located outside of the measuring place 100.

The measuring light generating section 70 is optically connected with the sensor section 50 through an optical system which comprises a polarization beam splitter 80, a Farady rotator 82, a polarizer 84, a lens 86, an optical fiber 88 and so on. Similarly, the calculator circuit 72 also is optically connected with the sensor section 50 through the same optical system.

The measuring light generating section 70 is operative to emit a coherent measuring light linearly polarized in a given direction. More particularly, the measuring light generating section 70 comprises a laser for generating and emitting a coherent laser beam and an optical system for collimating and linearly polarizing the laser beam before it is directed to the polarization beam splitter 80.

Said laser may be of any suitable type, such as HeNe laser, YAG laser, semiconductor laser and so on. In this embodiment, the semiconductor laser is used from the standpoint of matching with the optical fiber.

The polarization beam splitter 80 is operative to permit the passage of only the measuring light linearly polarized in the given direction and also to prevent the passage of any light rays polarized in all the directions other than the given direction, the light rays being then reflected in a further given direction. In this embodiment, the measuring light from the measuring light generating section 70 is polarized in a direction as shown by Z-axis in FIG. 1. Thus, the polarization beam splitter 80 permits the passage of only light rays polarized in the Z-axis direction and to reflect light rays polarized in a direction perpendicular to the plane of FIG. 1 (Y-axis direction) toward the calculator circuit 72. After passed through the polarization beam splitter 80, the measuring light enters the Farady rotator 82.

The Farady rotator 82 functions as polarization rotating means for rotating the polarized wavefront of the measuring light by a given angle in a direction in which the measuring light passes through the Farady rotator 82. In this embodiment, any suitable biasing means such as permanent magnet may be used to rotate the polarized wavefront of the measuring light by 45 degrees when the measuring light passes through the permanent magnet. The Farady rotator 82 may be of any other suitable means. This embodiment utilizes a combination of a permanent with a YIG crystal.

After passed through the Farady rotator 82, the measuring light enters the polarizer 84. The polarizer 84 is arranged to have a direction of polarization axis inclined 45 degrees to match the rotation of polarized wavefront in the Farady rotator 82. After passed through the polarizer 84, the measuring light is condensed by the lens 86 and then enters the optical fiber 88.

The optical fiber 88 may be of any suitable type, but this embodiment utilizes a polarization-maintaining fiber. After entered the optical fiber 88, the measuring light is propagated to the sensor section 50 located in the measuring place 100.

The sensor section 50 modulates the received measuring light depending on the intensity of an electromagnetic field in the measuring place 100. The modulated measuring light is again directed from the sensor section 50 to the optical fiber 88. More particularly, the sensor section 50 comprises an integrated optics 54 including an optical amplitude modulator section 66 for varying the amplitude of the measuring light by the use of external voltage, and a pair of antennas 52a and 52b.

The integrated optics 54 includes a waveguide 58 formed therein to receive the measuring light propagated through the optical fiber. The waveguide 58 is branched into first and second modulating waveguide portions 58a and 58b at a branching and combining point 60. The other end of the integrated optics 54 includes a reflecting face 62 formed therein, which is operative to reflect the measuring light propagated in the modulating waveguide portion 58a or 58b toward the entrance end thereof.

The optical amplitude modulator section 66 is a waveguide type optical modulator section formed as an integrated optics. Such a waveguide type optical amplitude modulator section 66 may be of any suitable type such as Mack-Zehnder inteferometer type, directional coupler type, crossing type and so on. This embodiment utilizes a slight modification of the Mack-Zehnder interferrometer.

The paired antennas 52a and 52b are operative to detect an electromagnetic field in the measuring place 100 and to output voltage signals representative of the detected intensity of the electromagnetic field. The antennas 52a and 52b may be of any suitable type, but preferably a minute dipole antenna type when it is desired to use them for detecting an electric field of high-frequency. For detecting an electric field of lowfrequency, a metal plate having an appropriate size may be utilized similarly.

After outputted from the antennas 52a and 52b, the voltage signals representative of the intensity of electromagnetic field are applied to the first and second modulating waveguide portions 58a and 58b through electrodes 64a and 64b, respectively. At this time, the polarities of these voltage signals are opposite to each other.

The integrated optics 54 may be made of any one of ferroelectric materials such as $LiNbO_3$ or $LiTaO_3$, semiconductor materials such as GaAlAs or Si or amorphous materials such as $SiO_2$ or $Si_3N_4$ This embodiment utilizes $LiNbO_3$ having a larger electro-optic effect.

The waveguides 58, 58a and 58b have their refractive indexes higher than that of the surrounding material such that they confine and guide the light waves.

The reflecting face 62 may be formed by depositing a thin film of metal material such as Al or Au or ferroelectric material on the ground end face of the integrated optics 54 with use of any suitable technique such as vapor deposition, spattering or the like.

In this embodiment, each of the antennas 52a and 52b is in the form of a simple metal plate for detecting an electric field of low-frequency. These antennas 52a and 52b are formed, as an integrated antenna section, on the same substrate as in the integrated optics 54 by the use of any suitable technique such as photolithograph.

Therefore, the sensor section 50 of this embodiment can be very easily handled and reduced in size since the integrated optics 54 and antennas 52a, 52b are formed as a unit on the same substrate.

In such an arrangement, the measuring light in the form of a coherent laser beam emitted from the measuring light generating section 70 enters the entrance end of the optical fiber 88 through which it is conducted into the waveguide 58. The measuring light then enters the optical amplitude modulator section 72 in which it is divided and directed into the first and second modulating waveguide portions 58a and 58b at the branching and combining point 60. Since the voltage signals representative of the intensity of the detected electromagnetic field have been applied from the antennas 52a and 52b to the optical amplitude modulator section 72, each of the waveguides 58a and 58b is changed in refractive index, depending on the intensity of the detected electromagnetic field. This will vary the phase of the light waves propagated through the waveguide.

Particularly, since the voltage signals having the opposite polarities have been applied respectively to the first and second modulating waveguide portions 58a and 58b, a phase difference will be created between the light waves propagated through the first modulating waveguide portion 58a and the light waves propagated through the modulating waveguide portion 58b.

The measuring light parts propagated through the first and second modulating waveguide portions 58a and 58b are reflected by the reflecting face 62 of the integrated optics 54 toward the first and second modulating waveguide portions 58a and 58b through which they are propagated in the opposite direction. Thus, the measuring light parts propagated through the first and second modulating waveguide portions 58a and 58b again pass through the optical amplitude modulator section 66 at which they are subjected to the second phase modulation. As a result, the phase difference becomes substantially two times larger than that of the measuring light parts before they are reflected by the reflecting face 62.

The measuring light parts reflected and propagated through the first and second modulating waveguide portions 58a and 58b are re-combined and caused to interfere with each other at the branching and combining point 60 wherein the phase difference will be converted into an amplitude of light. Thereafter, the measuring light modulated depending on the intensity of the electromagnetic field is again emitted from the entrance end 56 of the waveguide 58 toward the optical fiber 88.

The measuring light propagated through the optical fiber 88 then enters the Farady rotator 82 through the lens 86 and the polarizer 84, whereat the polarized wavefront of the measuring light is rotated 45 degrees in the direction of passage. The rotated measuring light then enters the polarization beam splitter 80.

After entered the polarization beam splitter 80, the polarized wavefront of the measuring light will be rotated 90 degrees relative to that of the measuring light initially entered the polarization beam splitter 80 from the measuring light generating section 70. Thus, this modulated measuring light cannot pass through the polarization beam splitter 80, but will be reflected to the calculator circuit 72.

The calculator circuit 72 is operative to calculate the intensity of the electromagnetic field in the measuring place 100, based on the amplitude of the measuring light reflected from the polarization beam splitter 80.

In this embodiment, the calculator circuit 72 comprises an optical detector 74 for converting the amplitude of the inputted measuring light into an electric signal, and a signal processing circuit 76 for processing the electric signal to determine the intensity of the electromagnetic field. After such a calculation, the intensity of the electromagnetic field is displayed on a display 78.

Figure 2:
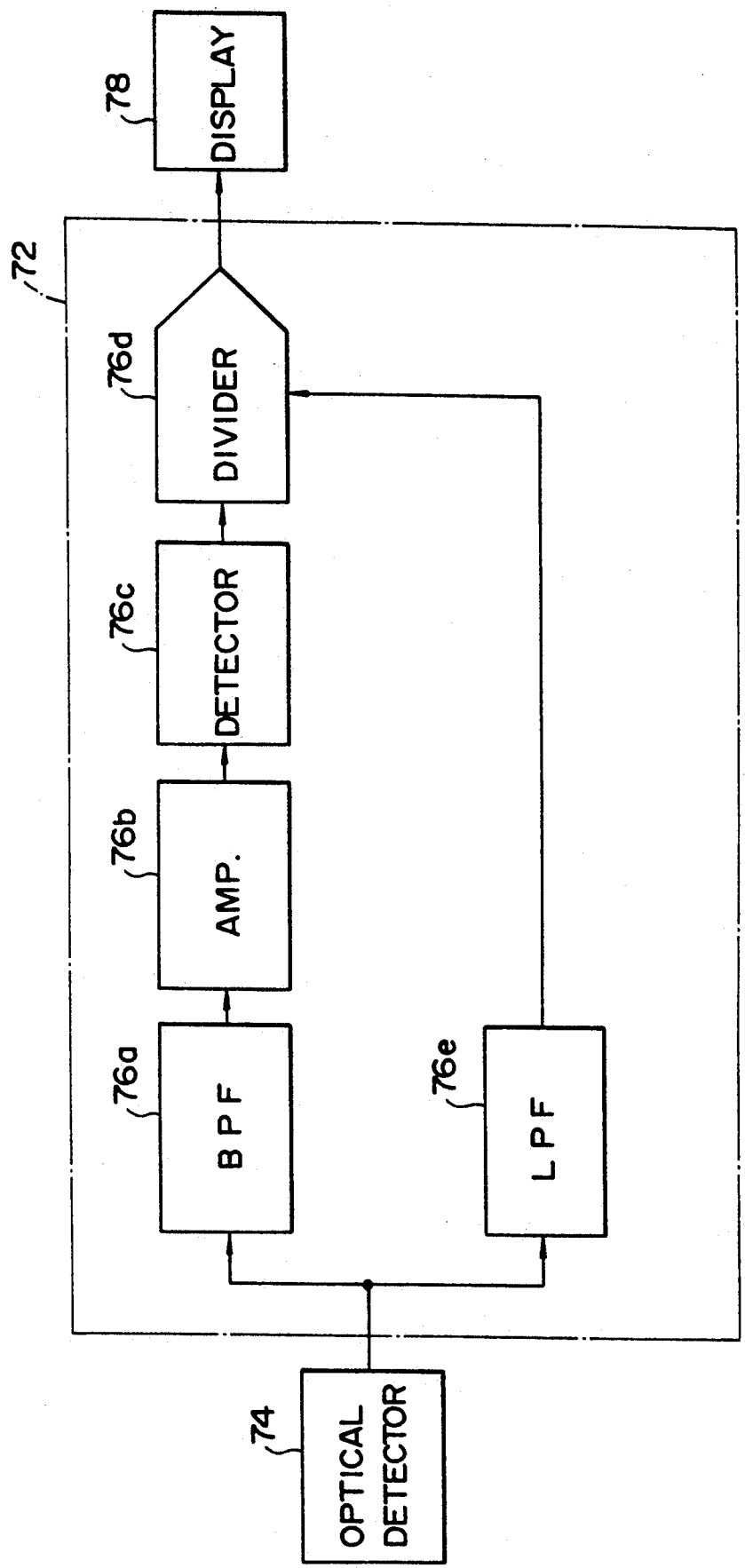
FIG. 2 is a block diagram of one concrete structure of the electromagnetic field intensity calculating circuit shown in FIG. 1.
Figure 3:
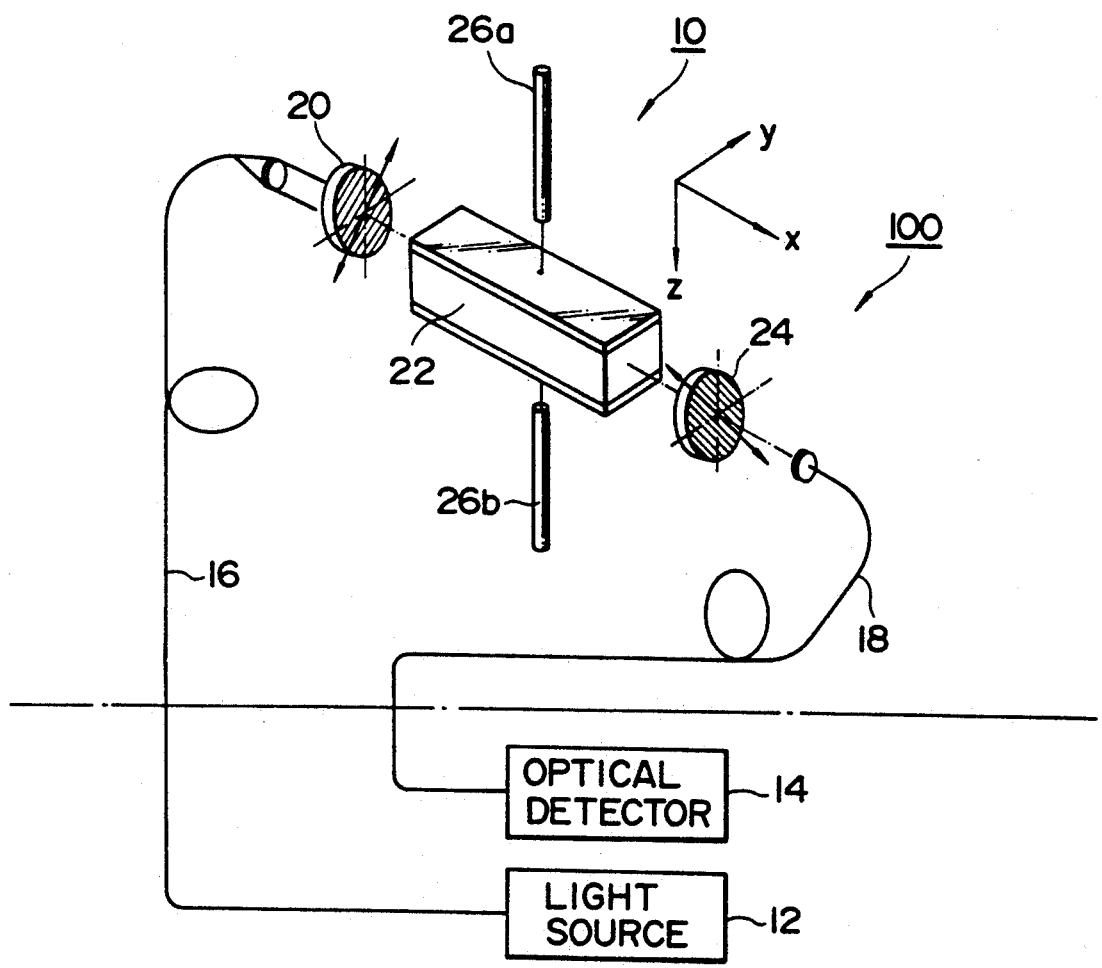
FIGS. 3, 4 and 5 illustrate electromagnetic field intensity measuring systems constructed in accordance with the prior art.
Figure 4:
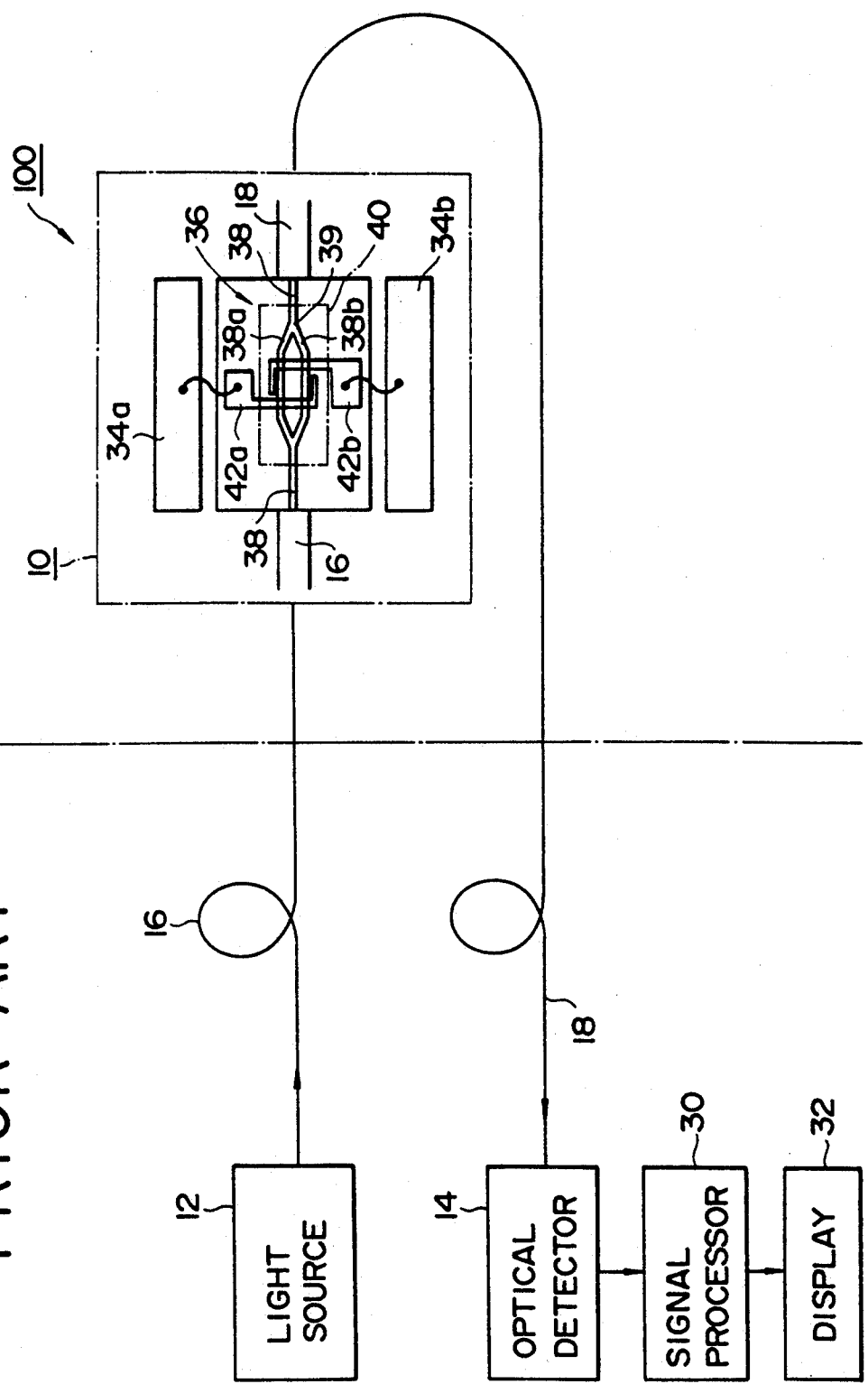
Figure 5:
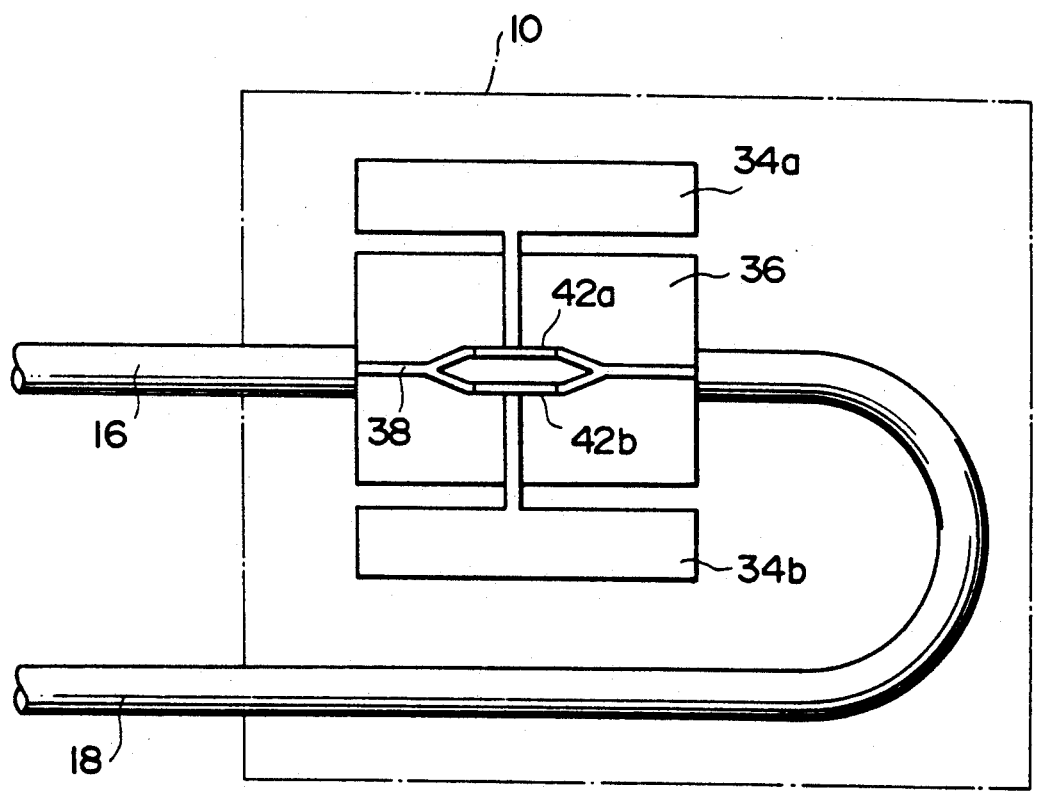

FIG. 2 shows the concrete arrangement of the signal processing circuit 76 which comprises a band pass filter 76a functioning as a first signal processing section, an amplifier 76b, a detector 76c, a divider 76d and a low-pass filter 76e functioning as a second signal processing section. The electric signal from the optical detector 74 enters the band pass filter 76a and the lowpass filter 76e.

The band pass filter 76a extracts a detection signal contained in the electric inputted signal and used to measure the intensity of the electromagnetic field. This detection signal is then amplified by the amplifier 76b and rectified by the detector 76c. Thereafter, the signal is outputted as a numerator in the divider 76d.

The low-pass filter 76e extracts from the inputted signal a component approximate to DC (that is, a signal containing a ripple variation component in the amplitude of the measuring light due to any disturbance). The extracted signal component is outputted to the divider 76d as a disturbance component detection signal which is in the form of a denominator.

The signal inputted to the divider as numerator and denominator contains the variation components due to the disturbance at the same rate.

The divider 76d is operative to execute a division against the inputted signal, to remove the disturbance variation components contained in the inputted detection signal through the detector 76c and to display the result on the display 78. The displayed result is accurately indicative of the intensity of the electromagnetic field measured without any disturbance variation component.

On operation, the measuring light generating section 70 first emits a coherent measuring light beam linearly polarized in the Z-axis direction. The measuring light passes through the polarization beam splitter 80, with the polarized wavefront thereof being rotated 45 degrees by the Farady rotator 82 in the direction of passage. Thereafter, the measuring light beam enters the polarization-maintaining fiber 88 through the polarizer and lens 84, 86.

At this time, the polarizer 84 permits the measuring light to pass therethrough substantially without loss since the polarizer 84 is inclined in the direction of polarization axix to match the rotation of the polarized wavefront by the Farady rotator 82.

After entered the optical fiber 88, the measuring light is propagated through the optical fiber 88 to the sensor section 50. As the measuring light reaches the sensor section 50, the former enters the waveguide 58 at the entrance end 56 thereof. The measuring light is then propagated through the waveguide 58 to the optical amplitude modulator section 66 wherein the measuring light is divided and directed into the first and second modulating waveguide portions 58a and 58b at the branching and combining point 60. The ratio of branch may be set at any suitable level, but generally be equal to 50 : 50.

During the propagation of the measuring light parts through the first and second modulating waveguide portions 58a and 58b, their phases are modulated depending on the magnitude of voltage applied to the electrodes 64a and 64b, that is, the intensity of the electromagnetic field in the measuring place 100 detected by the antennas 52a and 52b.

The electrodes 64a and 64b apply voltages to the first and second modulating waveguide portions 58a and 58b such that the polarities of these voltages are opposite to each other. Therefore, the phase of the measuring light part propagated through the first modulating waveguide portion 58a will be opposite to that of the measuring light part propagated through the second modulating waveguide portion 58b to create a phase difference therebetween.

After propagated through the first and second modulating waveguide portions 58a and 58b, the measuring light parts are reflected by the reflecting face 62 to re-propagate through the first and second modulating waveguide portions 58a and 58b in the opposite direction. The measuring light parts again pass through the optical amplitude modulator section 66 whereat the measuring light parts are subjected to the second phase modulation. The phase difference between the measuring light parts propagating through the first and second modulating waveguide portions 58a and 58b will be substantially twice that of the measuring light parts before they are reflected by the reflecting face 62.

In such a manner, the sensor section 50 can have a sensitivity about twice that of the non-reflection type sensor having the same dimensions. If it is not required to vary the sensitivity, the size of the sensor can be reduced about one-half.

After passed through the first and second modulating waveguide portions 58a and 58b in the opposite direction, the measuring light parts are re-combined and caused to interfere with each other at the branching and combining point 60. Thus, the degree of the phase difference will be converted into the amplitude of light.

More particularly, the maximum amplitude can be provided when there is externally no electromagnetic field and if the phase difference is zero. On the other hand, the minimum amplitude will be provided when there is externally an electromagnetic field and if the phase difference is 180 degrees. If the amplitude of the modulated light beam is measured, the degree of the phase difference and thus the intensity of the electromagnetic field can be determined.

In such a manner, the modulated measuring light beam outputted from the optical amplitude modulator 66 enters the optical fiber 88 from the entrance end 56 of the waveguide 58 and passes through the optical system 86, polarizer 84 and Farady rotator 82 before entering the polarization beam splitter 80.

The Farady rotator 82 is a so-called non-reciprocity element which is operative to rotate the polarized wavefronts of both the light waves moving forward and rearward in the FIG. 2 by 45 degrees in the same angular direction. Thus, the measuring light emitted from the sensor section 50 after passed through the Farady rotator 82 is rotated 45 degrees in the Y-axis direction and therefore reflected to the optical detector 74 by the polarization beam splitter 80.

In this embodiment, the provision of the polarizer 84 is to improve the function of the Farady rotator 82.

In spite of the good flexibilities (polarization-maintaining properties) of the polarization-maintaining fiber 88 and integrated optics 54, these elements will create any light wave component having a direction of polarization axis different from that of the initially polarized wavefront due to various affecting factors such as temperature, pressure, vibration and so on when the measuring light is being propagated through the optical fiber and integrated optics 88, 54. The polarizer 84 functions to prevent light waves containing such noise components from passing therethrough.

The optical detector 74 functions to convert the modulated measuring light into an electric signal and to direct it to the signal processing circuit 76 as shown in FIG. 2.

The signal inputted into the signal processing circuit 76 contains various variation components due to the variations of the laser source which forms a part of the measuring light generating section 70 and/or due to any disturbance applied to the optical fiber 88 and others (which results from variations in temperature, vibration, pressure and so on). Consequently, the signal cannot be used to perform the accurate measurement of the electromagnetic field intensity as it is.

The inventors have found that these variation components are contained in the signal as components approximate to DC. Thus, the electric signal from the optical detector 74 is inputted into the band pass filter 76a and the low-pass filter 76e.

The band pass filter 76a co-operates with the amplifier 76b and detector 76c to extract a detection signal of a given frequency band from the inputted signal, the detection signal being used to measure the intensity of electromagnetic field. The detection signal is then amplified and rectified to form an electromagnetic field intensity measuring signal which is in turn outputted to the divider 76d.

The low-pass filter 76e extracts a signal approximate to DC from the electric signal inputted thereinto, the former signal containing variation components due to any disturbance. This is then outputted to the divider 76d.

The detection signal outputted through the optical detector 76c contains variation components due to the disturbance at the same rate as that of the variation component signal from the low-pass filter 76e.

When the divider 76d is used such that the detection signal from the detector 76c is divided by the variation component signal from the low-pass filter 76e, any variation component contained in the detection signal can be removed. As a result, the intensity of the electromagnetic field can be determined accurately. The result will be displayed on the display 78.

It is now assumed that the measuring light generating section 70 emits a measuring light beam having its amplitude equal to $I_O$. As the measuring light beam passes through the optical amplitude modulator section 66 and reaches the optical detector 74, the optical detector 74 outputs a signal I represented by:

$$I = (I_O + \Delta I_O)\{1 + \cos(V_O \pi \sin\omega t)/V_\pi\}$$

wherein $V_O \sin\omega$ t is an alternate current signal proportional to the external voltage applied to the optical amplitude modulator electrode; $V_\pi$ is an applied voltage required to vary the amplitude of the light outputted from the optical amplitude modulator section from maximum to minimum and called "half-wave voltage"; and $\Delta I_O$ is a variation due to disturbance.

When this signal I is outputted as through the band pass filter 76a, the output thereof $I\omega$ is given by:

$$I\omega = (I_O + \Delta I_O)\pi/V_\pi V_O \sin\omega t.$$

As the signal I is outputted as through the low-pass filter 76c, the output $I_{dc}$ is given by:

$$I_{dc} = I_O + \Delta I_O.$$

As the divider 76d performs the aforementioned division, therefore, the value R thereof is given by:
$$R = I_w/I_{dc} \pi/V_\pi V_O \sin\omega t.$$

Thus, the variation component due to the disturbance can be removed. The resulting value R accurately represents the intensity of the electromagnetic field itself.

As will be apparent from the foregoing, the measuring apparatus of the present invention can increase its sensitivity about twice since the measuring light conducted into the integrated optics 54 is twice modulated in phase by two passages of the measuring light through the optical amplitude modulator sections 66. In comparison with the non-reflection type sensors, the sensor section 50 of the present invention can be reduced in size about one-half if the same sensitivity is to be maintained.

In accordance with the present invention, further, the single optical fiber 88 is used to perform the input and output of the measuring light through the integrated optics 54. The sensor section 50 can be easily formed to be of a cantilever type structure without bending of the optical fiber. As a result, the sensor section 50 can be further reduced in size without being subject to any limitation due to the bending of the optical fiber. If desired, the sensor section 50 may have a diameter equal to or less than one millimeter. Thus, the sensor section 50 can be reduced up to its size one-tenth smaller than those of the conventional sensors. By using such a sensor section 50, the intensity of electromagnetic field can be measured even in a narrower or smaller space which would not be used in the prior art.

In accordance with the present invention, a single optical fiber 88 is only required to be connected with the waveguide 58 of the integrated optics 54. More particularly, the connection between the optical fiber and the waveguide requires the most precise adjustment and tends to be subjected to changes in characteristics due to any mechanical deviation created when the system is used for a prolonged period. Since the present invention provides the number of such connections decreased one-half that of the prior art, the sensor section 50 which can operate steadily and also with high-accuracy for a prolonged period can be manufactured inexpensively.

The measuring apparatus of the present invention can accurately measure the environment of an electromagnetic field to be measured in the measuring place 100 by the use of the sensor section 50 without any disturbance against said environment.

As described, the present invention can overcome various problems in the prior art with respect to space utility, sensitivity and so on and can measure the electromagnetic field intensity over an increased range of frequency band by the use of a smaller and high-sensitive sensor 50, without any disturbance of the environment of an electromagnetic field to be measured.

We claim:

1. An electromagnetic field intensity measuring apparatus comprising:

measuring light generating means for emitting a coherent measuring light linearly polarized in a given direction;

optical fiber means for conducting said measuring light to an electromagnetic field measuring place;

sensor means located in said electromagnetic field measuring place for receiving the measuring light from said optical fiber means, said sensor means being adapted to modulate the amplitude of the measuring light entering the sensor means depending on the intensity of the electromagnetic field, the modulated light being then re-applied to said optical fiber means;

polarization rotating means located between said measuring light generating means and said optical fiber means, said polarization rotation means being operative to cause the polarized wavefront of the, measuring light passed therethrough to rotate a given angle relative to the direction of passage;

a polarization beam splitter disposed between said measuring light generating means and said polarization rotating means, said polarization beam splitter being operative to permit only the measuring light from said measuring light generating means to pass through said polarization beam splitter and also to reflect the modulated measuring light inputted through said polarization rotating means in a predetermined direction; and calculator means for calculating the intensity of electromagnetic field in the electromagnetic field measuring place, based on the amplitude of the measuring light reflected by said polarization beam splitter, said sensor means comprising:

antenna section for detecting the electromagnetic field and also for outputting a voltage corresponding to the intensity of the detected electromagnetic field;

an integrated optics, said integrated optics being separate from said optical fiber means, said integrated optics including a waveguide formed therein, one end of said waveguide being a measuring light entering section and the other end thereof being a measuring light reflecting section, and optical amplitude modulator means operative to apply a voltage signal outputted from said antenna section to said waveguide and also to modulate the amplitude of the measuring light Propagated through the waveguide depending on the intensity of the electromagnetic field before the modulated measuring light is outputted therefrom.

2. An electromagnetic field intensity measuring apparatus as defined in claim 1 wherein said optical amplitude modulator means is of a Mack-Zehnder interferometer type.

3. An electromagnetic field intensity measuring apparatus as defined in claim 2 wherein said waveguide includes first and second modulating waveguide portions branched at a branching and combining point, the other end of each of said first and second modulating waveguide portions including said measuring light reflecting portion formed therein, said optical amplitude modulator means including electrode means formed therein such that the voltage signal from said antenna section will be applied to said first and second modulating waveguide portions as voltage signals having the opposite polarities to each other, the measuring light parts propagating through the respective modulating waveguide portions being changed in phase before they are re-combined and caused to interfere with each other at said branching and combining point, whereby the measuring light having its amplitude modulated depending on the electromagnetic field intensity can be outputted from said optical amplitude modulator means.

4. An electromagnetic field intensity measuring apparatus as defined in claim 1 wherein said measuring light generating means comprises a source of laser light for emitting a coherent laser beam and an optical system for collimating and linearly polarizing the emitted laser beam in a given direction, the collimated and polarized laser beam being then outputted from said optical system to said polarization beam splitter.

5. An electromagnetic field intensity measuring apparatus as defined in claim 1 wherein said polarization rotating means includes a Farady rotator for rotating the polarized wavefront of the light waves passed therethrough by a given angle.

6. An electromagnetic field intensity measuring apparatus as defined in claim 1 wherein said optical fiber means includes a polarization-maintaining fiber.

7. An electromagnetic field intensity measuring apparatus as defined in claim 1 wherein said integrated optics is formed of $LiNbO_3$.

8. An electromagnetic field intensity measuring apparatus as defined in claim 1 wherein said antenna section is in the form of an integrated antenna unit formed on the same substrate as that of said integrated optics by the use of photolithography.

9. An electromagnetic field intensity measuring apparatus as defined in claim 1 wherein the measuring light reflecting section formed in said integrated optics is in the form of a thin film of metal or ferroelectric material which is formed on the ground end face of the substrate in said integrated optics.

10. An electromagnetic field intensity measuring apparatus as defined in claim 1, further comprising a polarizer located between said polarization rotating means and said optical fiber means, said polarizer being operative to permit only the measuring light having its polarized wavefront rotated by said polarization rotating means through the given angle to pass therethrough, whereby the measuring light inputted from said integrated optics through said optical fiber means to said polarizer can be outputted to said polarization rotating means after any noise component has been removed therefrom.

11. An electromagnetic field intensity measuring apparatus comprising:

measuring light generating means for emitting a coherent measuring light lineraly polarized in a given direction;

optical fiber means for conducting said measuring light to an electromagnetic field measuring place;

sensor means located in said electromagnetic field measuring place for receiving the measuring light from said optical fiber means, said sensor means being adapted to modulate the amplitude of the measuring light entering the sensor means depending on the intensity of the electromagnetic field, the modulated light being then re-applied to said optical fiber means;

polarization rotating means located between said measuring light generating means and said optical fiber means, said polarization rotation means being operative to cause the polarized wavefront of the measuring light passed therethrough to rotate a given angle relative to the direction of passage;

a polarization beam splitter disposed between said measuring light generating means and said polarization rotating means, said polarization beam splitter being operative to permit only the measuring light from said measuring light generating means to pass through said polarization beam splitter and also to reflect the modulated measuring light inputted through said polarization rotating means in a predetermined direction;

calculator means for calculating the intensity of electromagnetic field in the electromagnetic field measuring place, based on the amplitude of the measuring light reflected by said polarization beam splitter;

said sensor means comprising an antenna section for detecting the electromagnetic field and also for outputting a voltage corresponding to the intensity of the detected electromagnetic field, an integrated optics including a waveguide formed therein, one end of said waveguide being a measuring light entering section and the outer end thereof being a measuring light reflecting section, and optical amplitude modulator means operative to apply a voltage signal outputted from said antenna section to said waveguide and also to modulate the amplitude of the measuring light propagated through the waveguide depending on the intensity of the electromanetic field before the modulated measuring light is outputted therefrom; and wherein said calculator means comprises an optical detector for converting the inputted measuring light into an electric signal, a first signal processing section for extracting and outputting a signal component used to detect the electromagnetic field intensity from said electric signal, a second signal processing section for extracting and outputting a low-frequency component signal containing any disturbance component from said electric signal, and a calculating section for removing any disturbances component from the electromagnetic field intensity detection signal outputted from said first signal processing section and for calculating the electromagnetic field intensity in the electromagnetic field measuring place, based on the signal outputted from said second signal processing section, whereby the electromagnetic field intensity can be measured without affection of said disturbance.

12. An electromagnetic field intensity measuring apparatus as defined in claim 11 wherein said calculator means further comprises:

a polarizer located between said polarization rotating means and said optical fiber means, said polarizer being operative to permit only the measuring light having its polarized wavefront rotated by said polarization rotating means through the given angle to pass therethrough, whereby the measuring light inputted from said integrated optics through said optical fiber means to said polarizer can be outputted to said polarization rotating means after any noise component has been removed therefrom.

13. An electromagnetic field intensity measuring apparatus as defined in claim 12 wherein said first signal processing section includes a band pass filter for extracting and outputting a signal used to measure the electromagnetic field intensity as a detection signal and wherein said second signal processing section includes a low-pass filter for extracting a component approximate to DC from said electric signal and for outputting the extracted signal component as a signal used to detect the disturbance.

14. An electromagnetic field intensity measuring apparatus as defined in claim 3 wherein said measuring light generating section includes a source of laser beam for emitting a coherent laser beam and an optical system for collimating and linearly polarizing said laser beams for said source in a given direction before said laser beam is outputted to said polarization beam splitter.

15. An electromagnetic field intensity measuring apparatus as defined in claim 3 wherein said integrated optics is made of $LiNbO_3$.

16. An electromagnetic field intensity measuring apparatus as defined in claim 3 wherein said antenna section is in the form of an integrated antenna unit formed on the same substrate as that of said integrated optics by the use of photolithography.

17. An electromagnetic field intensity measuring apparatus comprising:

measuring light generating means for emitting a coherent measuring light linearly polarized in a given direction;

optical fiber means for conducting said measuring light to an electromagnetic field measuring place;

sensor means located in said electromagnetic field measuring place for receiving the measuring light from said optical fiber means, said sensor means being adapted to modulate the amplitude of the measuring light entering the sensor means depending on the intensity of the electromagnetic field, the modulated light being then re-applied to said optical fiber means;

polarization rotating means located between said measuring light generating means and said optical fiber means, said polarization rotation means being operative to cause the polarized wavefront of the measuring light passed therethrough to rotate a given angle relative to the direction of passage;

a polarization beam splitter disposed between said measuring light generating means and said polarization rotating means, said polarization beam splitter being operative to permit only the measuring light from said measuring light generating means to pass through said polarization beam splitter and also to reflect the modulated measuring light inputted through said polarization rotating means in a predetermined direction;

calculator means for calculating the intensity of electromagnetic field in the electromagnetic field measuring place, based on the amplitude of the measuring light reflected by said polarization beam splitter;

wherein said sensor means comprises an antenna section for detecting the electromagnetic field and also for outputting a voltage corresponding to the intensity of the detected electromagnetic field, an integrated optics including a waveguide formed therein, one end of said waveguide being a measuring light entering section and the outer end thereof being a measuring light reflecting section, and optical amplitude modulator means operative to apply a voltage signal outputted from said antenna section to said waveguide and also to modulate the amplitude of the measuring light propagated through the waveguide depending on the intensity of the electromagnetic field before the modulated measuring light is outputted therefrom;

wherein said waveguide includes first and second modulating waveguide portions branched at a branching and combining point, the other end of each of said first and second modulating waveguide portions including said measuring light reflecting portion formed therein, said optical amplitude modulation means including electrode means formed therein such that the voltage signal from said antenna section will be applied to said first and second modulating waveguide portions as voltage signals having the opposite polarities to each other, the measuring light parts propagating through the respective modulating waveguide portions being changed in phase before they are re-combined and caused to interfere with each other at said branching and combining point, whereby the measuring light having its amplitude modulated depending on the electromagnetic field intensity can be outputted from said optical amplitude modulator means; and a polarizer located between said polarization rotating means and said optical fiber means, said polarizer being operative to permit only the measuring light having its polarized wavefront rotated by the polarization rotating means through the given angle to pass therethrough, whereby the measuring light inputted from said integrated optics through said optical fiber means to said polarizer can be outputted to said polarization rotating means after any noise component has been removed.

18. An electromagnetic field intensity measuring apparatus as defined in claim 3 wherein said calculator means comprises:

an optical detector for converting the inputted measuring light into an electric signal;

a first signal processing section for extracting and outputting a signal component used to detect the electromagnetic field intensity from said electric signal;

a second signal processing section for extracting and outputting a low-frequency component signal containing any disturbance component from said electric signal; and a calculating section for removing any disturbance component from the electromagnetic field intensity detection signal outputted from said first signal processing section and for calculating the electromagnetic field intensity in the electromagnetic field measuring place, based on the signal outputted from said second signal processing section, whereby the electromagnetic field intensity can be measured without affection of any disturbance.

19. An electromagnetic field intensity measuring apparatus as defined in claim 18 wherein said calculator means further comprises:

a polarizer located between said polarization rotating means and said optical fiber means, said polarizer being operative to permit only the measuring light having its polarized wavefront rotated by said polarization rotating means through the given angle to pass therethrough, whereby the measuring light inputted from said integrated optics through said optical fiber means to said polarizer can be outputted to said polarization rotating means after any noise component has been removed therefrom.

20. An electromagnetic field intensity measuring apparatus as defined in claim 19 wherein said first signal processing section includes a band pass filter for extracting and outputting a signal used to measure the electromagnetic field intensity as a detection signal and wherein said second signal processing section includes a low-pass filter for extracting a component approximate to DC from said electric signal and for outputting the extracted signal component as a signal used to detect the disturbance.

* * * * *